(12) United States Patent
Siew et al.

(10) Patent No.: US 10,079,147 B2
(45) Date of Patent: Sep. 18, 2018

(54) METHOD OF FORMING INTERCONNECTS FOR SEMICONDUCTOR DEVICES

(71) Applicant: Samsung Electronics Co., Ltd., Suwon-si (KR)

(72) Inventors: Yong Kong Siew, Suwon-si (KR); Sung Yup Jung, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 62 days.

(21) Appl. No.: 15/082,588

(22) Filed: Mar. 28, 2016

(65) Prior Publication Data

US 2017/0033006 A1 Feb. 2, 2017

(30) Foreign Application Priority Data

Jul. 31, 2015 (KR) .................. 10-2015-0108958

(51) Int. Cl.
| | |
|---|---|
| *H01L 21/44* | (2006.01) |
| *H01L 21/033* | (2006.01) |
| *H01L 21/324* | (2006.01) |
| *H01L 21/768* | (2006.01) |

(52) U.S. Cl.
CPC ........ *H01L 21/0332* (2013.01); *H01L 21/324* (2013.01); *H01L 21/76801* (2013.01); *H01L 21/76811* (2013.01); *H01L 21/76813* (2013.01); *H01L 21/76834* (2013.01); *H01L 21/76897* (2013.01)

(58) Field of Classification Search
CPC ............................... H01L 21/76897
USPC ........................................... 438/666
See application file for complete search history.

(56) References Cited

U.S. PATENT DOCUMENTS

| | | | |
|---|---|---|---|
| 7,553,760 B2 | 6/2009 | Yang et al. | |
| 7,602,066 B2 | 10/2009 | Brakensiek et al. | |
| 7,696,085 B2 | 4/2010 | Li et al. | |
| 8,394,718 B1 | 3/2013 | Gambino et al. | |
| 8,415,248 B2 | 4/2013 | Chen et al. | |
| 8,900,988 B2 | 12/2014 | Lin et al. | |
| 9,666,451 B2 * | 5/2017 | Wallace | H01L 21/486 |
| 2014/0015135 A1 | 1/2014 | Rieger et al. | |
| 2014/0191409 A1 | 7/2014 | Lao | |
| 2014/0322910 A1 | 10/2014 | Tang et al. | |
| 2014/0363969 A1 | 12/2014 | Chen et al. | |
| 2014/0367855 A1 | 12/2014 | Rieger et al. | |
| 2015/0054122 A1 | 2/2015 | Lin et al. | |

(Continued)

*Primary Examiner* — Hsin-Yi Hsieh
(74) *Attorney, Agent, or Firm* — Muir Patent Law, PLLC

(57) ABSTRACT

A method of forming interconnects for semiconductor devices includes forming a lower insulating layer and a lower interconnect on a semiconductor substrate, forming an insulating pattern layer on the lower interconnect through self-assembly, forming an interlayer insulating layer and a trench mask on the insulating pattern layer, forming a preparatory via hole allowing the insulating pattern layer to be exposed by removing a portion of the interlayer insulating layer, forming a trench by etching the interlayer insulating layer using the trench mask, forming a via hole allowing the lower interconnect to be exposed by selectively etching the insulating pattern layer within the preparatory via hole, and filling the trench and the via hole with an conductive material.

17 Claims, 24 Drawing Sheets

(56) References Cited

U.S. PATENT DOCUMENTS

2015/0064915 A1 3/2015 Wuister
2015/0093702 A1 4/2015 Nyhus et al.

* cited by examiner

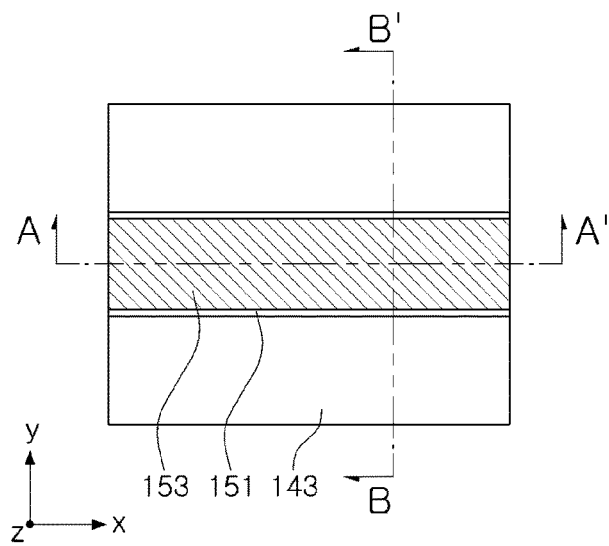
FIG. 2A
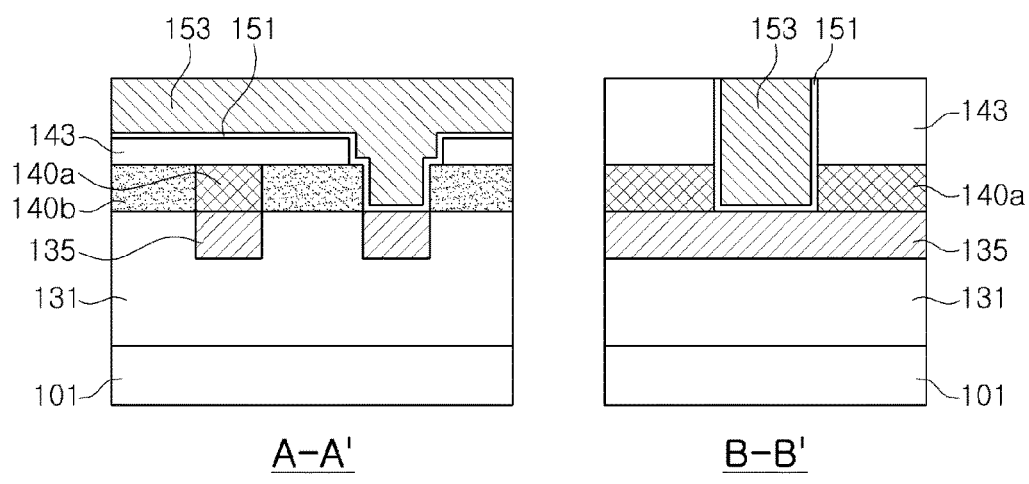
A-A'
FIG. 2B
B-B'
FIG. 2C

A-A'

B-B'

A-A'

B-B'

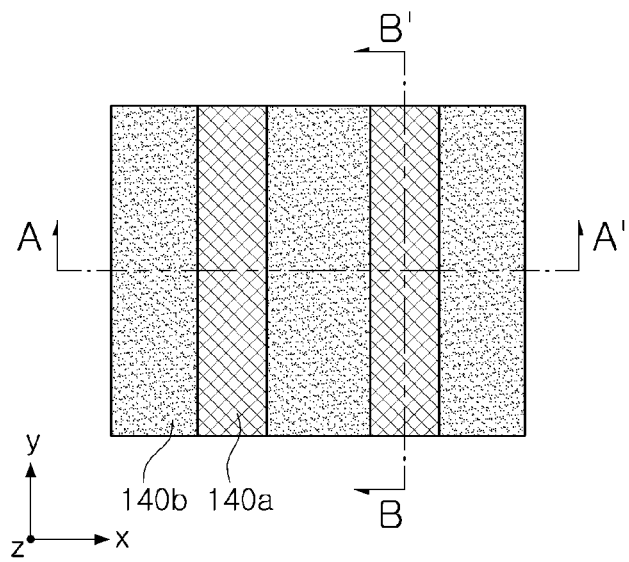
FIG. 5A
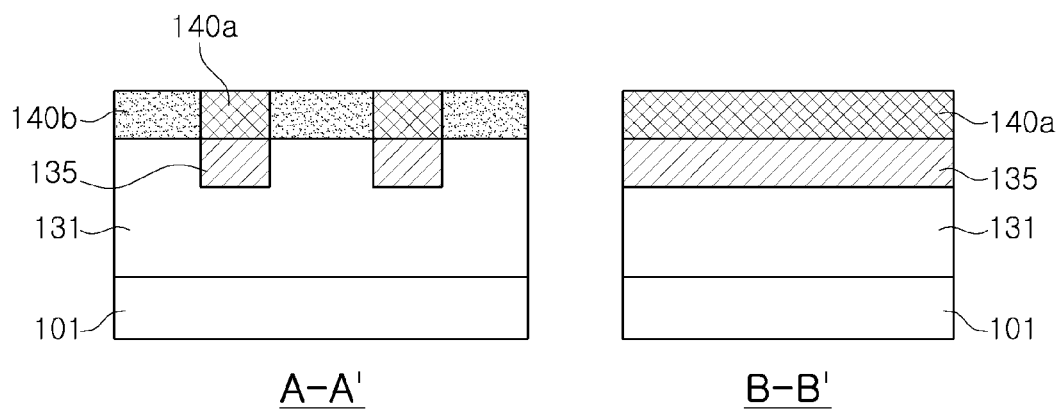
A-A'
FIG. 5B
B-B'
FIG. 5C

A-A'

B-B'

A-A'

B-B'

B1-B1'

A-A'

B-B'

A-A'

B-B'

A-A'

B-B'

A-A'

B-B'

A-A'

B-B'

A-A'

B-B'

B1-B1'

A-A'

B-B'

A-A'

B-B'

C-C'

D-D'

C-C'

D-D'

C-C'

D-D'

C-C'

D-D'

C-C'

D-D'

METHOD OF FORMING INTERCONNECTS FOR SEMICONDUCTOR DEVICES

CROSS-REFERENCE TO RELATED APPLICATION

This application claims priority to and benefit of Korean Patent Application No. 10-2015-0108958, filed on Jul. 31, 2015, with the Korean Intellectual Property Office, the disclosure of which is incorporated herein by reference.

BACKGROUND

The present disclosure relates to a method of forming interconnects for semiconductor devices.

Increases in the speeds of complementary metal oxide semiconductor (CMOS) logic devices may have typically depended on reducing gate delay times, based on reductions in gate length. Currently, however, as semiconductor devices have become highly integrated, the speed of devices may have come to depend largely on a resistance capacitance (RC) delay caused by metal wires formed, for example, in back end of line (BEOL). In order to reduce the RC delay, copper having a specific resistance lower than that of aluminum, and having more better resistance to electro-migration and stress directed migration characteristics than that of aluminum, has been used as a metal interconnect material. Such copper is not easily etched, and thus, in order to precisely form a copper interconnect, misalignment of an interconnect process should be reduced.

SUMMARY

An aspect of the present disclosure may provide a method of forming interconnects for semiconductor devices, in which a via may be auto-aligned with a lower interconnect.

According to example embodiments, a method of forming interconnects for semiconductor devices may include providing a semiconductor substrate, forming a lower insulating layer on the semiconductor substrate, forming a lower interconnect in the lower insulating layer and on the semiconductor substrate, forming an insulating pattern layer on an upper surface of the lower interconnect through self-assembly, forming an interlayer insulating layer and a trench mask on the insulating pattern layer, forming a photoresist pattern on the trench mask to allow the interlayer insulating layer to be partially exposed, forming a first via hole allowing the insulating pattern layer to be exposed by removing a portion of the interlayer insulating layer using the photoresist pattern, removing the photoresist pattern, forming a trench by etching the interlayer insulating layer using the trench mask after removing the photoresist pattern, forming a second via hole allowing the lower interconnect to be exposed by selectively etching the insulating pattern layer within the first via hole, and filling the trench and the second via hole with a conductive material.

The forming of the insulating pattern layer may include forming a block copolymer layer on the lower interconnect and the lower insulating layer, and heating the block copolymer layer to cause a phase separation of the block copolymer layer into a first polymer pattern layer arranged on an upper surface of the lower interconnect and a second polymer pattern layer arranged on an upper surface of the lower insulating layer.

The first polymer pattern layer and the second polymer pattern layer may have etching selectivity with respect to each other.

The block copolymer layer may include a silicon-containing polymer.

According to example embodiments, a method of forming interconnects for semiconductor devices may include forming a lower insulating layer and a lower interconnect on a semiconductor substrate, forming an insulating pattern layer on an upper surface of the lower interconnect through self-assembly, forming a via hole by selectively etching a portion of the insulating pattern layer, and filling the via hole with an conductive material.

According to example embodiments, a method of forming an interconnect for a semiconductor device may include providing a semiconductor substrate, forming a lower insulating layer on the semiconductor substrate, forming a lower interconnect in the lower insulating layer and on the semiconductor substrate, forming an insulating pattern layer on the lower insulating layer through self-assembly, forming a first via hole by selectively etching a first portion of the insulating pattern layer, forming a second via hole by etching a second portion of the insulating pattern layer, and filling the second via hole with a conductive material. The insulating pattern layer may include either a block copolymer layer having a first polymer pattern contacting a top surface of the lower insulating layer and a second polymer pattern contacting a top surface of the lower interconnect, wherein the first via hole is formed by selectively etching a portion of the second polymer pattern with respect to the first polymer pattern, or a self-assembled monolayer contacting the top surface of the lower interconnect, wherein the first via hole is formed by selectively etching a portion of the self-assembled monolayer with respect to the lower insulating layer.

According to example embodiments, a method of forming an interconnect for a semiconductor device may include providing a semiconductor substrate, forming a first insulating layer on the on the semiconductor substrate, forming a first interconnect in the first insulating layer and on the semiconductor substrate, forming an insulating pattern layer on the first interconnect by self-assembly, forming a second insulating layer on the insulating pattern layer and first insulating layer, forming photoresist pattern to remove a first portion of the insulating pattern layer and a portion of the second insulating layer, forming a via hole by etching a second portion of the insulating pattern layer, and filling the via hole with a conductive material. In forming the photoresist pattern, the photoresist pattern may include an opening having a width in a first direction greater than a width of the first portion of the insulating pattern layer in the first direction.

BRIEF DESCRIPTION OF DRAWINGS

The above and other aspects, features and other advantages of the present disclosure will be more clearly understood from the following detailed description taken in conjunction with the accompanying drawings, in which:

FIGS. 1 and 2A to 2C are drawings illustrating a interconnect structure for semiconductor devices according to example embodiments;

FIGS. 3A to 3C, 4A to 4C, 5A to 5C, 6A to 6C, 7A to 7C, 8A to 8D, and 9A to 9C are drawings illustrating a method of forming interconnects for semiconductor devices according to example embodiments;

DETAILED DESCRIPTION

Figure 1:
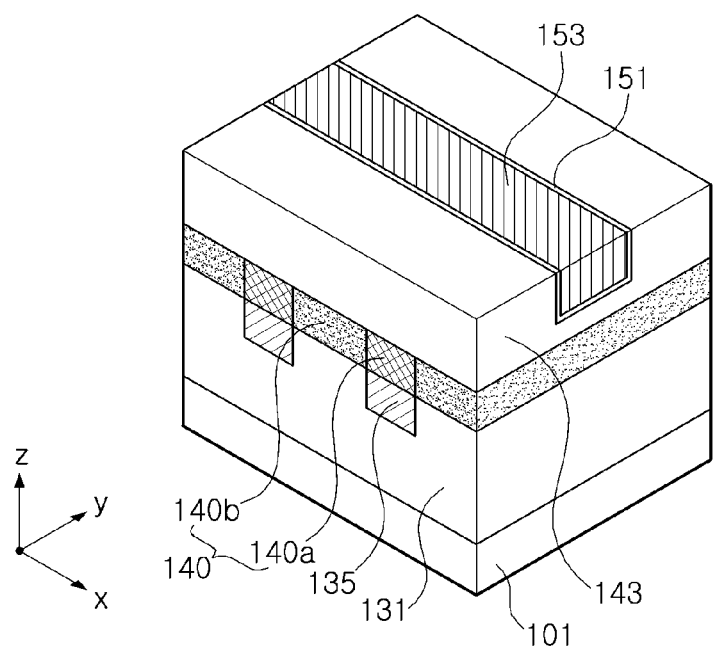

Hereinafter, embodiments of the present disclosure will be described as follows with reference to the attached drawings.

The present inventive concept may, however, be exemplified in many different forms and should not be construed as being limited to the specific embodiments set forth herein.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, or as "contacting" or "in contact with" another element, there are no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. Unless indicated otherwise, these terms are only used to distinguish one member, component, region, layer or section from another. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, members, elements, and/or groups thereof, but do not preclude the presence or addition of one or more other features, integers, steps, operations, members, elements, and/or groups thereof.

Unless the context indicates otherwise, terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to schematic views illustrating embodiments of the present disclosure. In the drawings, for example, due to manufacturing techniques and/or tolerances, modifications of the shape shown may be estimated, and the thicknesses of layers and regions are exaggerated for clarity. Like reference numerals in the drawings denote like elements, and thus their description may be omitted. Thus, example embodiments of the present disclosure is not to be construed as limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

FIGS. 1 and 2A to 2C to 2C are drawings illustrating a interconnect structure for semiconductor devices according to example embodiments. Here, FIG. 1 is a perspective view, FIG. 2A is a plan view of FIG. 1, and FIGS. 2B and 2C are cross-sectional views of FIG. 2A taken along line A-A' and B-B'.

As used herein, a semiconductor device may refer to any of the various devices such as shown in FIGS. 1, 2A to 2C, 3A to 3C, 4A to 5C, 5A to 5C, 6A to 6C, 7A to 7C, 8A to 8D, 9A to 9C, 10, 11A to 11C, 12A to 12C, 13A to 13C, 14A to 14C, 15A to 15D, 16A to 16C, 17, 18A to 18C, 19A to 19C, 20A to 20C, 21A to 21C, and 22A to 22C, and may also refer, for example, to a transistor or a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory module, a hard drive including additional components, a mobile phone, laptop, tablet, desktop, camera, server, computing system, or other consumer electronics device, etc.

With reference to FIGS. 1 and 2A to 2C, a lower insulating layer 131 and a lower interconnect 135 may be formed on a substrate (e.g., a semiconductor substrate) 101. A first polymer pattern layer 140a arranged on an upper surface of the lower interconnect 135 and a second polymer pattern layer 140b arranged on the lower insulating layer 131 may be formed above the substrate 101. An interlayer insulating layer 143 and a metal interconnect layer 153 may be formed on the first and second polymer pattern layers 140a and 140b.

The substrate 101 may have an upper surface extending in an x-axis direction and a y-axis direction. The substrate 101 may include a semiconductor material, for example, a group IV semiconductor, a group III-V compound semiconductor or a group II-VI compound semiconductor, or the like. For instance, examples of the substrate 101 may include a silicon substrate, a germanium substrate, a silicon-germanium substrate, a gallium arsenide substrate, a silicon-on-insulator (SOI) substrate or a semiconductor-on-insulator (SeOI) substrate, and the like. A plurality of active elements, for example, transistors, configuring an integrated circuit, and passive elements may be provided. The transistors may include gate electrodes and source/drain regions. Contact plugs may be connected to the gate electrodes and the source/drain regions. In addition, a metal pad and local interconnects connected to the contact plugs may be formed.

The lower insulating layer 131 may be formed to cover the active and passive elements, the contact plugs, the metal pad and the local interconnects. The lower insulating layer 131 may include a low K material to reduce an RC signal delay and a crosstalk between interconnects. The lower insulating layer 131 may include a low K organic polymer or inorganic substance. As the organic polymer, for example, a poly allyl ether-based resin, a fluoride poly allyl ether-based resin, a polypentafluorostylene-based resin, a polytetrafluorostylene-based resin, a polyimide fluoride-based resin, or a polynaphthalene fluoride-based resin, Black Diamond™, SiLK™, or the like may be used. As the inorganic substance, for example, undoped silicate glass (USG), tetraethylorthosilicate (TEOS), fluorine-doped silicate glass (FSG), organosilicate glass (OSG), hydrogen silsesquioxane (HSQ), methyl silsesquioxane (MSQ), SiOF, SiOC, SiOCH, or the like may be used.

The lower interconnect 135 may be a metal interconnect formed in a back end of line (BEOL) process. The lower interconnect 135 may include at least one selected from a group consisting of, for example, aluminum (Al), an aluminum alloy (Al-alloy), tungsten (W), cobalt (Co), copper (Cu), or ruthenium (Ru), gold (Au), silver (Ag), and the like. A capping layer (not shown) may be formed on the lower interconnect 135. The capping layer may include at least one selected from a group consisting of cobalt (Co), ruthenium (Ru), CoWP, and the like. An upper surface of the lower interconnect 135 may be coplanar with an upper surface of the lower insulating layer 131.

The first polymer pattern layer 140a arranged on an upper surface of the lower interconnect 135 and the second polymer pattern layer 140b arranged on an upper surface of the lower insulating layer 131 may be formed by a process in which a block copolymer layer 140 including two types of polymer blocks is subjected to a self-assembly process directed by a difference between characteristics of upper surfaces of the lower interconnect 135 and the lower insulating layer 131, for example, hydrophilicity and hydrophobicity.

The first and second polymer pattern layers 140a and 140b may have the same function as the interlayer insulating layer 143 maintaining electrical insulation between the metal interconnect layer 153 and the lower interconnect 135.

The interlayer insulating layer 143 may include a low-k organic polymer or inorganic substance in a manner similar to that of the lower insulating layer 131 described above.

The metal interconnect layer 153 may be formed within a trench that is formed in a linear shape, for example, extending in an x-axis direction of FIG. 2A. In addition, the metal interconnect layer 153 may also be formed on the lower interconnect 135 through an opening (a via hole) formed by removing a portion of the interlayer insulating layer 143 and a portion of the first polymer pattern layer 140a. For instance, the metal interconnect layer 153 may have a dual damascene interconnect structure. A barrier layer 151 may be disposed between the metal interconnect layer 153 and layers adjacent thereto, for example, the interlayer insulating layer 143, the first and second polymer pattern layers 140a and 140b. The barrier layer 151 may prevent a component of the metal interconnect layer 153, for example, copper, from diffusing into layers adjacent thereto. The barrier layer 151 and the metal interconnect layer 153 may include a conductive material. The barrier layer 151 may include at least one selected from a group consisting of Ti, Ta, W, TiN, TaN, WN, WCN, TiSiN, TaSiN and WSiN. The metal interconnect layer 153 may include at least one selected from a group consisting of aluminum (Al), an aluminum (Al) alloy, copper (Cu), gold (Au), silver (Ag), tungsten (W) and molybdenum (Mo).

FIGS. 3A to 3C, 4A to 4C, 5A to 5C, 6A to 6C, 7A to 7C, 8A to 8D, and 9A to 9C are drawings illustrating a method of forming interconnects for semiconductor devices according to example embodiments.

Figure 3A:
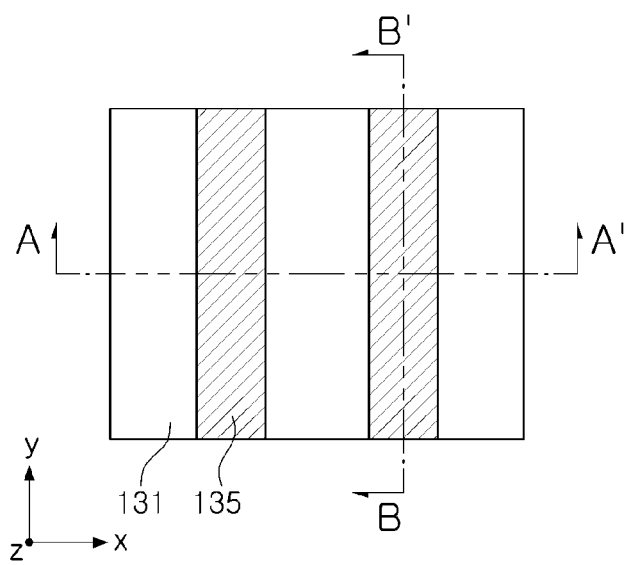
Figure 3B:
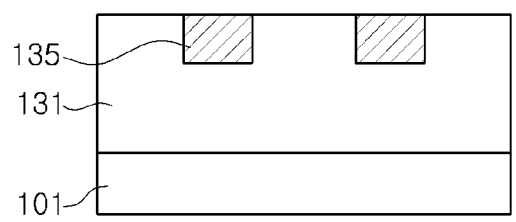
Figure 3C:
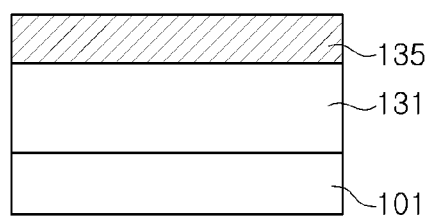

With reference to FIGS. 3A to 3C, the lower insulating layer 131 and the lower interconnect 135 may be formed on a substrate 101. An upper surface of the lower insulating layer 131 may be coplanar with an upper surface of the lower interconnect 135. The lower interconnect 135 may be formed in linear shape extending, for example, in a y-axis direction of FIG. 3A. The upper surface of the lower insulating layer 131 and the upper surface of the lower interconnect 135 may have different chemical properties with each other. For instance, one surface of the upper surfaces of the lower insulating layer 131 and the lower interconnect 135 may be hydrophilic and the other surface may be hydrophobic. The upper surface of the lower insulating layer 131 and the upper surface of the lower interconnect 135 may be subjected to a surface treatment to have different chemical properties with each other.

Figure 4A:
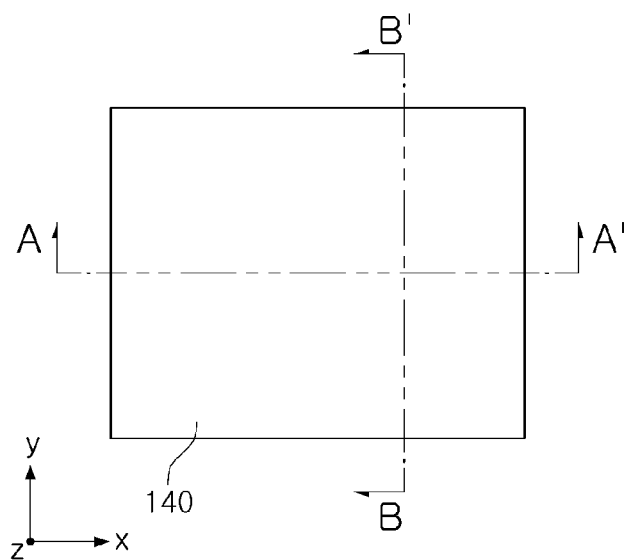
Figure 4B:
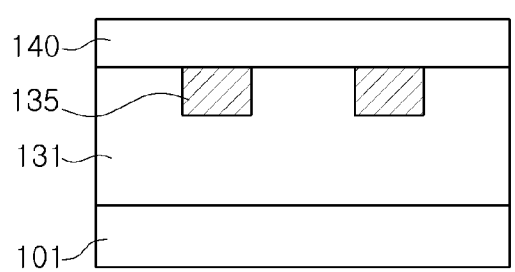
Figure 4C:
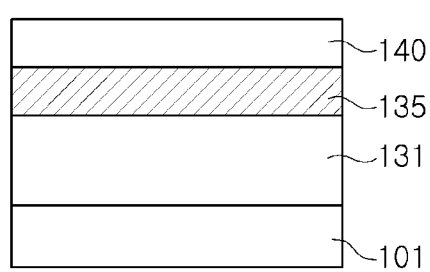

With reference to FIGS. 4A to 4C, a block copolymer layer 140 may be formed on the lower insulating layer 131 and the lower interconnect 135. The block copolymer layer 140 may be formed by dissolving a block copolymer in a solvent and then performing a spin coating process thereon.

The block copolymer layer 140 may include a block copolymer containing at least two types of polymer blocks. The block copolymer may be a polymer in which two types of polymer blocks are coupled to each other through a covalent bond. The polymer blocks may have different properties. For instance, any one polymer block may exhibit hydrophilic properties and another may exhibit hydrophobic properties. The polymer block having the hydrophilic properties may have polarity. Due to a difference in such properties, a phase separation of the block copolymer may be caused through a self-assembly process.

In example embodiments, when the block copolymer includes two types of polymer blocks, as the block copolymer, for example, polystyrene-block-polymethylmethacrylate, polybutadiene-block-polybutylmethacrylate, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, or the like may be used.

In addition, as the block copolymer, a block copolymer in which one of two types of polymer blocks is a silicon-containing polymer may be used. For example, as the block copolymer, polybutadiene-block-polydimethylsiloxane, polystyrene-block-polydimethylsiloxane, polyisobutylene-block-polydimethylsiloxane, (polystyrene-block-polyferrocenyldimethylsilane, polystyrene-block-polyferrocenylethylmethylsilane, or the like may be used. However, a block copolymer usable according to example embodiments is not limited to these examples illustrated above, and various types of block copolymers may be used.

With reference to FIGS. 5A to 5C, the block copolymer layer 140 (FIG. 4) may be heat treated such that phase separation of the block copolymer layer 140 into the first polymer pattern layer 140a and the second polymer pattern layer 140b may be caused. The first polymer pattern layer 140a may be arranged on an upper surface of the lower interconnect 135, and the second polymer pattern layer 140b may be arranged on an upper surface of the lower insulating layer 131. The phase separation may be caused by the self-assembly of the block copolymer layer 140 directed by the upper surface of the lower interconnect 135 and the upper surface of the lower insulating layer 131 having different chemical properties. For example, when the block copolymer layer 140 includes the first polymer block having hydrophobic properties and the second polymer block having hydrophilic properties, an upper surface of the lower interconnect 135 is hydrophobic, and an upper surface of the lower insulating layer 131 is hydrophilic; the first polymer block may be arranged on the upper surface of the lower interconnect 135 to form the first polymer pattern layer 140a and the second polymer block may be arranged on the upper surface of the lower insulating layer 131 to form the second polymer pattern layer 140b, through a heat treatment. In this specification, the first polymer pattern layer 140a may be referred to an insulating pattern layer.

In example embodiments, the heat treatment may be performed at Tg (glass transition temperature) of the block copolymer or higher. For example the heat treatment may be performed at a temperature of about 100° C. to about 350° C.

Figure 6A:
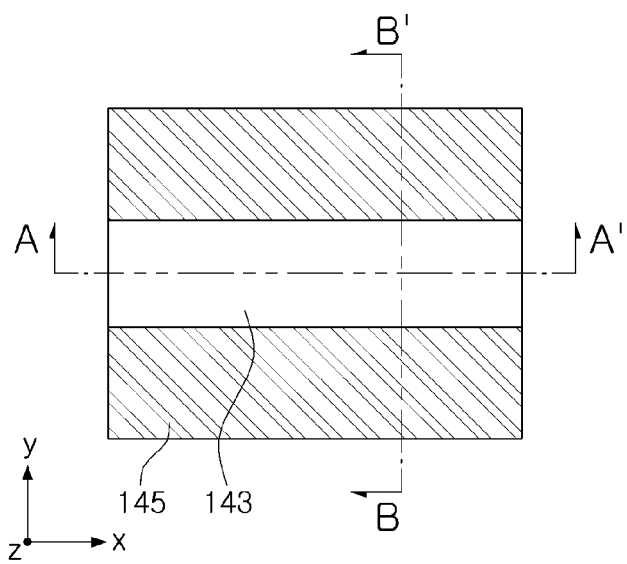
Figure 6B:
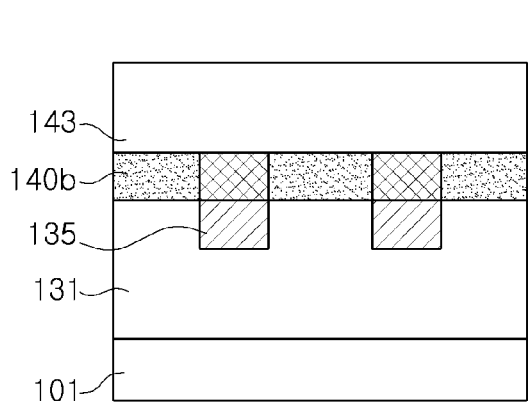
Figure 6C:
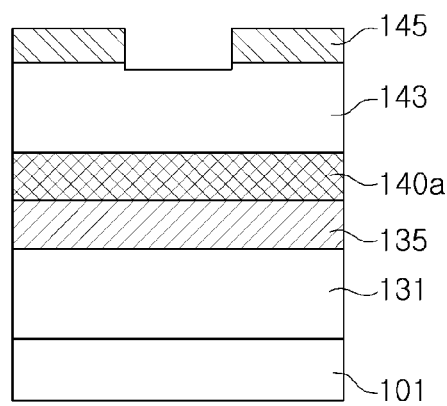

With reference to FIGS. 6A to 6C, an interlayer insulating layer 143 and a trench mask 145 may be formed on the first and second polymer pattern layers 140a and 140b.

First, the interlayer insulating layer 143 may be formed on the first and second polymer pattern layers 140a and 140b. The interlayer insulating layer 143 may include a low-k organic polymer or inorganic substance in a manner similar to the lower insulating layer 131 described above. A formation method of the interlayer insulating layer 143 may be performed using plasma enhanced chemical vapor deposition (PECVD), high density plasma chemical vapor deposition (HDP-CVD), atmospheric pressure chemical vapor deposition (APCVD), spin coating, or the like.

Next, the trench mask 145 may be formed on the interlayer insulating layer 143. After a hard mask layer is formed on the interlayer insulating layer 143, the hard mask layer may be dry etched in linear shape using a photoresist pattern (not shown) having an opening with a linear shape extending, for example, in an x-axis direction of FIG. 6A, thereby forming the trench mask 145. For example, a portion of the interlayer insulating layer 143 may be removed by using the trench mask 145. The hard mask layer may contain, for example, TiN. The photoresist pattern may be removed after the trench mask 145 is formed.

Figure 7A:
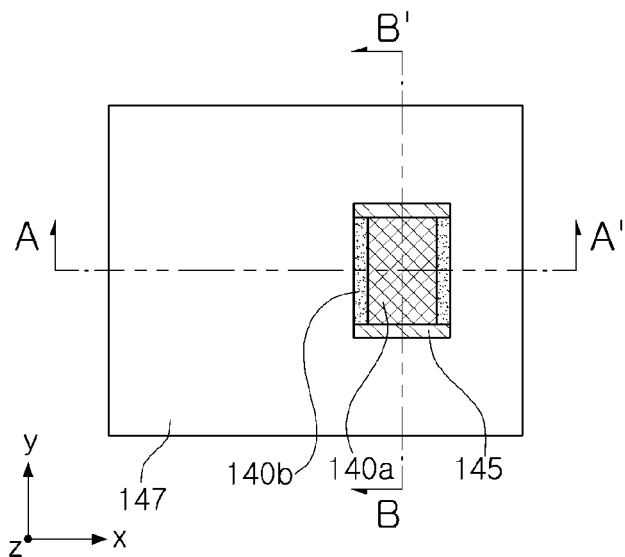
Figure 7B:
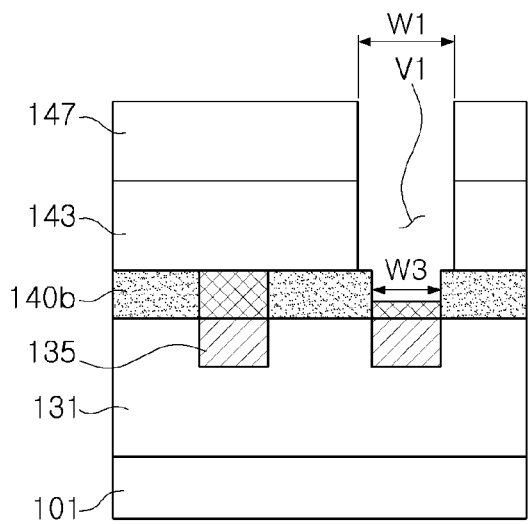
Figure 7C:
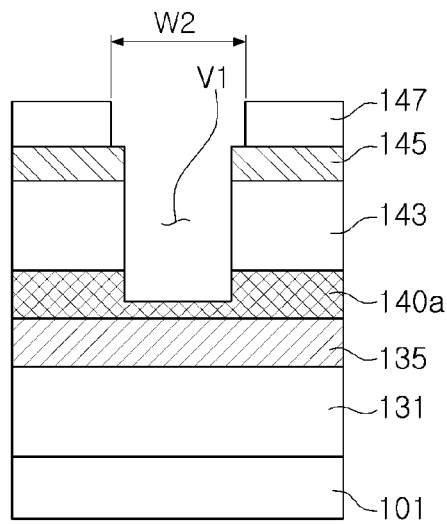
Figure 8A:
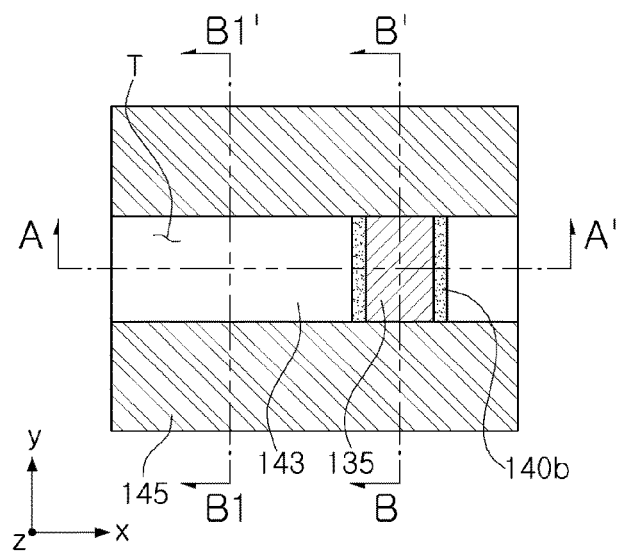
Figure 8D:
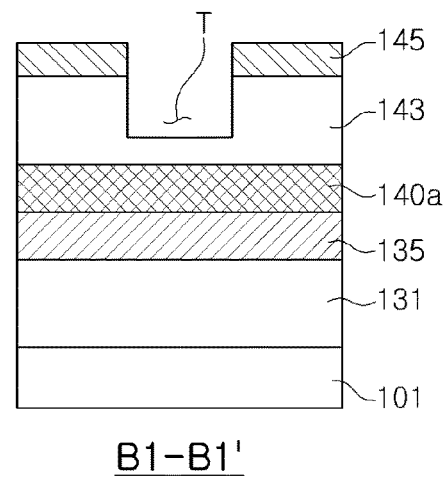
Figure 8B:
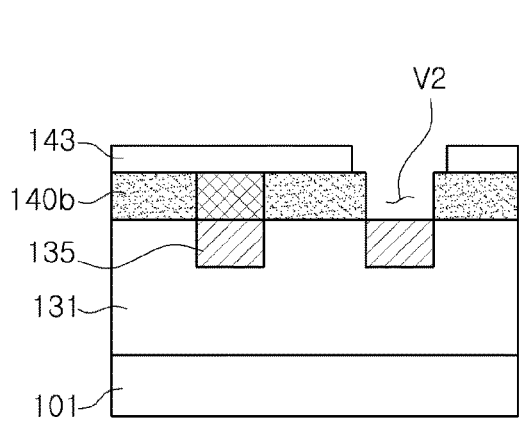
Figure 8C:
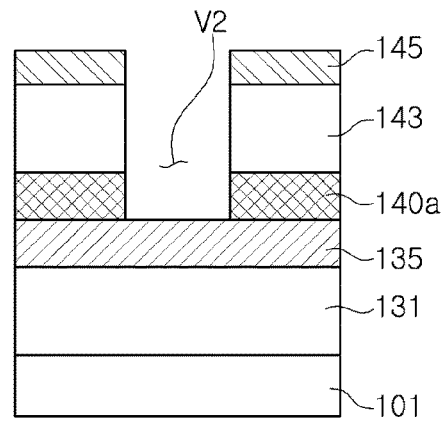

With reference to FIGS. 7A to 7C, a preparatory via hole V1 allowing the first polymer pattern layer 140a to be exposed may be formed.

First, a photoresist pattern 147 allowing the interlayer insulating layer 143 to be partially exposed may be formed on the trench mask 145 and the interlayer insulating layer 143. The photoresist pattern 147 may include an opening formed in a position thereof to be aligned with a position of a portion of the first polymer pattern layer 140a to be removed in a subsequent process. For example, the opening of the photoresist pattern 147 may have a first width W1 in an x-axis direction of FIG. 7A or have a second width W2 in a y-axis direction of FIG. 7A. The second polymer pattern layer 140b may also include an opening having a third width W3 in the x-axis direction of FIG. 7A after removing the portion of the first polymer pattern layer 140a. In consideration of misalignment, the first width W1 may be greater than the third width W3. In example embodiments, the photoresist pattern 147 may have the opening having the second width W2 to be exposed a portion of the trench mask 145 in the y-axis direction of FIG. 7A.

Subsequently, the preparatory via hole V1 may be formed to allow the first polymer pattern layer 140a to be exposed by removing a portion of the interlayer insulating layer 143 using the photoresist pattern 147. The interlayer insulating layer 143 may be removed through a dry etching process, and the first polymer pattern layer 140a may serve as an etch-stop layer. A portion of the second polymer pattern layer 140b may also be exposed through the formed preparatory via hole V1.

For example, a portion of the first polymer pattern layer 140a may be selectively removed with respect to the second polymer pattern layer 140b. Since the first and second polymer pattern layers 140a and 140b include different polymer blocks, the second polymer pattern layer 140b may have etching selectivity with the first polymer pattern layer 140a. For example, under specific etching conditions, the first polymer pattern layer 140a may have an etching rate faster than that of the second polymer pattern layer 140b. For instance, when the first polymer pattern layer 140a is a silicon-containing polymer, the first polymer pattern layer 140a may be selectively removed using an etching gas containing fluorine, for example, CxFy or the like. For example, a portion of the first polymer pattern layer 140a may be partially retained so as to prevent the lower interconnect 135 from being exposed. In a case in which the lower interconnect 135 is exposed, the lower interconnect 135 may be consumed or polluted during a removal process of the photoresist pattern 147, thereby a reliability of a interconnect structure may be degraded. According to example embodiments, the process of selectively removing a portion of the first polymer pattern layer 140a with respect to the second polymer pattern layer 140b may be omitted. For example, after a trench is formed, the first polymer pattern layer 140a may be removed once.

The photoresist pattern 147 may be removed through an ashing and stripping process.

With reference to FIGS. 8A to 8D, a trench T and a via hole V2 may be formed.

The trench T may be formed by removing the interlayer insulating layer 143 using the trench mask 145 exposed after removing the photoresist pattern 147.

A depth of the trench T may be formed in such a way that a portion of the interlayer insulating layer 143 remains on the first and second polymer pattern layers 140a and 140b. In a manner different from the illustration, the trench T may be formed to allow upper surfaces of the first and second polymer pattern layers 140a and 140b to be exposed.

Subsequently, the via hole V2, allowing the exposure of the lower interconnect 135 therethrough, may be formed by selectively removing the first polymer pattern layer 140a within the preparatory via hole V1 (FIGS. 7A to 7C).

Figure 9A:
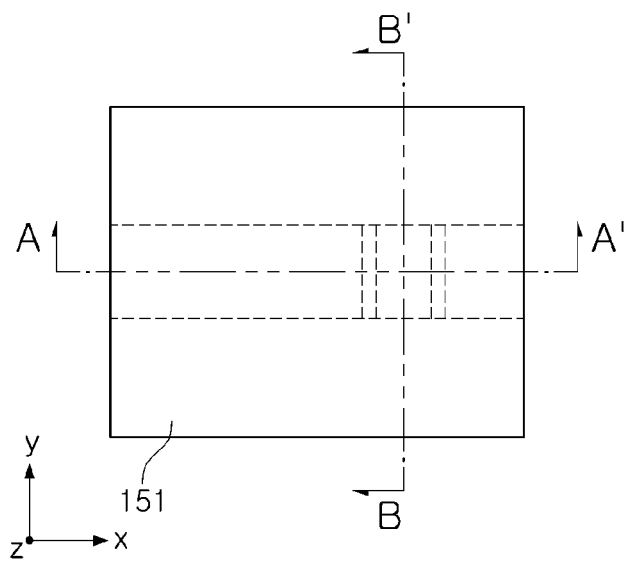
Figure 9B:
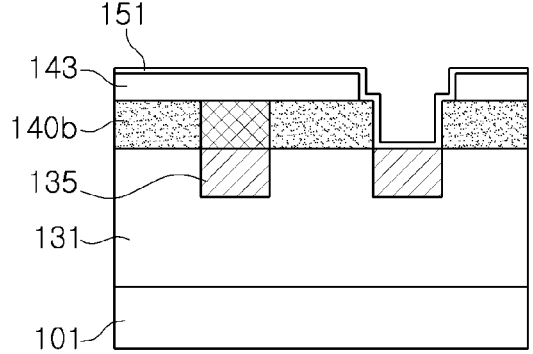
Figure 9C:
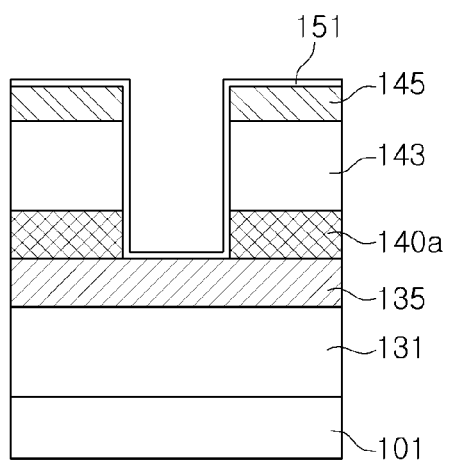

With reference to FIGS. 9A to 9C, a barrier layer 151 may be formed on sidewalls and a bottom of the trench T and the via hole V2 and on the trench mask 145.

The barrier layer 151 may include a conductive material. The barrier layer 151 may contain at least one of a group consisting of titanium (Ti), tantalum (Ta), tungsten (W), TiN, TaN, WN, WCN, TiSiN, TaSiN and WSiN. As a formation method of the barrier layer 151, any one selected from physical vapor deposition (PVD), chemical vapor deposition (CVD), and atomic layer deposition (ALD) may be used.

For example, the metal interconnect layer 153 may be formed on the barrier layer 151 to fill the trench T and the via hole V2, and then, a planarization process may be performed thereon to allow the interlayer insulating layer 143 to be exposed thereby. Thus, a dual damascene interconnect structure illustrated in FIGS. 1 and 2A to 2C may be formed.

The metal interconnect layer 153 may include at least one selected from a group consisting of aluminum (Al), an aluminum (Al) alloy, copper (Cu), gold (Au), silver (Ag), tungsten (W) and molybdenum (Mo). As a method of forming the metal interconnect layer 153, any one selected from a reflow method performed after a sputtering process, a chemical vapor deposition (CVD) method, and an electroplating method may be used. In example embodiments, when the electroplating method is used, a seed layer may be formed to allow a current to flow at the time of electrolysis.

Figure 10:
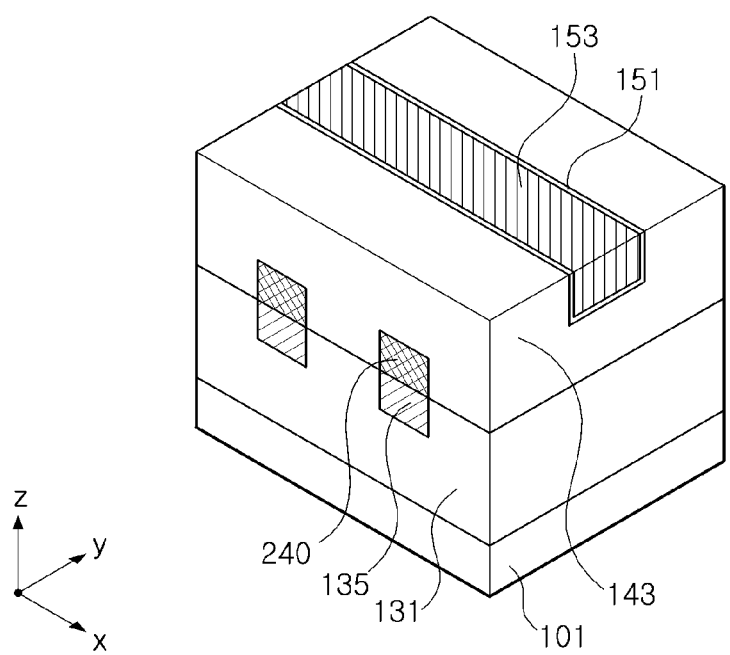
FIGS. 10 and 11A to 11C illustrate a interconnect structure for semiconductor devices according to example embodiments.
Figure 11A:
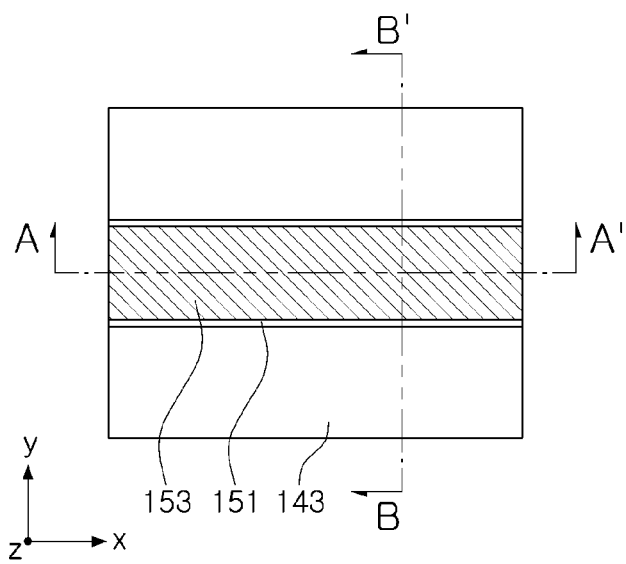
Figure 11B:
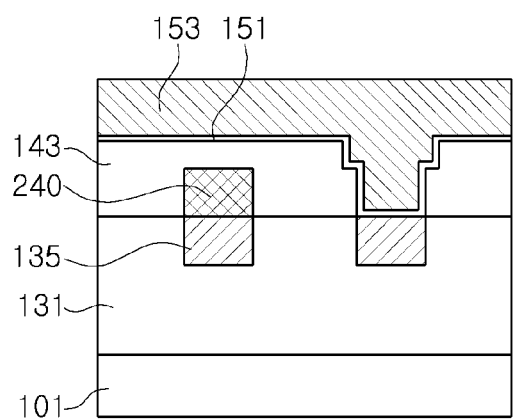
Figure 11C:
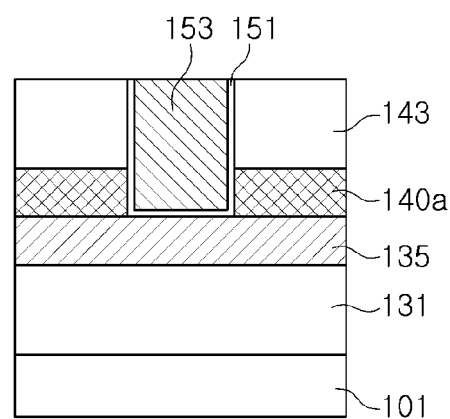

FIGS. 10 and 11A to 11C illustrate a interconnect structure for semiconductor devices according to example embodiments. FIG. 10 is a perspective view of a interconnect structure for semiconductor devices, FIG. 11A is a plan view of FIG. 10, and FIGS. 11B and 11C are cross-sectional views of FIG. 11A taken along line A-A' and line B-B', respectively.

A interconnect structure for semiconductor devices illustrated in FIGS. 10 and 11A to 11C is the same as that of FIGS. 1 and 2A to 2C except for illustration of an insulating pattern layer 240 formed on a lower interconnect 135 and an interlayer insulating layer 143 formed directly on a lower insulating layer 131. Thus, duplicated descriptions thereof may be omitted.

With reference to FIGS. 10 and 11A to 11C, the lower insulating layer 131 and the lower interconnect 135 may be formed on a substrate 101. The insulating pattern layer 240 arranged on an upper surface of the lower interconnect 135 may be formed above the substrate 101. The interlayer insulating layer 143 and the metal interconnect layer 153 may be formed on the insulating pattern layer 240. The interlayer insulating layer 143 may also be formed on the lower insulating layer 131.

The insulating pattern layer 240 may include a self-assembled monolayer (SAM). The self-assembled monolayer (SAM) may be, for example, an organic SAM or a functionalized nanoparticle (FNP) layer. The SAM may have a reaction group, polymer chain and a functional group, and may only be arranged on a specific portion of a lower structure depending on whether the reaction group is hydrophilic or hydrophobic. The FNP may only be arranged on a specific portion of a lower structure depending on whether a material capped on a surface thereof is hydrophilic or hydrophobic.

FIGS. 12A to 12C, 13A to 13C, 14A to 14C, 15A to 15D, and 16A to 16C illustrate a method of forming interconnects for semiconductor devices according to example embodiments. In describing a method of forming interconnects for semiconductor devices illustrated in FIGS. 10 and 11A to 11C with reference to FIGS. 12A to 12C, 13A to 13C, 14A to 14C, 15A to 15D, and 16A to 16C, descriptions overlapping with the description with reference to FIGS. 3A to 3C, 4A to 4C, 5A to 5C, 6A to 6C, 7A to 7C, 8A to 8D, and 9A to 9C may only be provided briefly.

Figure 12A:
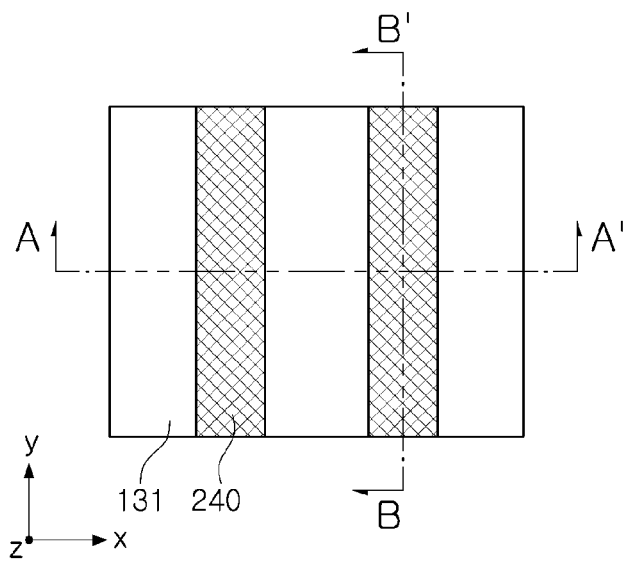
FIGS. 12A to 12C, 13A to 13C, 14A to 14C, 15A to 15D, and 16A to 16C illustrate a method of forming interconnects for semiconductor devices according to example embodiments.
Figure 12B:
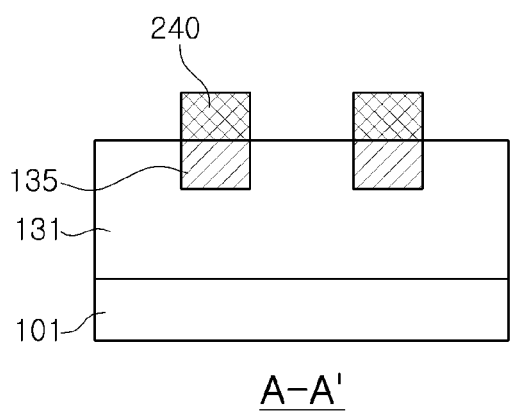
Figure 12C:
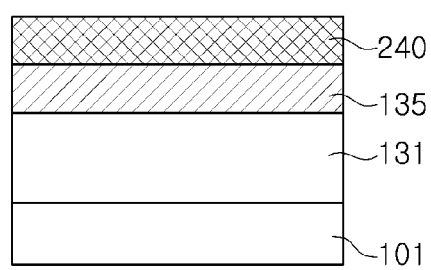

Referring to FIGS. 12A to 12C, the lower insulating layer 131 and the lower interconnect 135 may be formed on the substrate 101. An upper surface of the lower insulating layer 131 may be coplanar with an upper surface of the lower interconnect 135. The lower interconnect 135 may be formed in a linear shape extending, for example, in a y-axis direction of FIG. 12A. One surface of the upper surfaces of the lower insulating layer 131 and the lower interconnect 135 may be hydrophilic and the other surface may be hydrophobic. Thus, the insulating pattern layer 240 may be arranged on an upper surface of the lower interconnect 135. In example embodiments, the substrate 101 may be dipped into a solution in which a material capable of forming a self-assembled monolayer, for example, an organic SAM or FNP, is diluted to form a self-assembled monolayer only adsorbed onto an upper surface of the lower interconnect 135, thereby forming the insulating pattern layer 240.

Figure 13A:
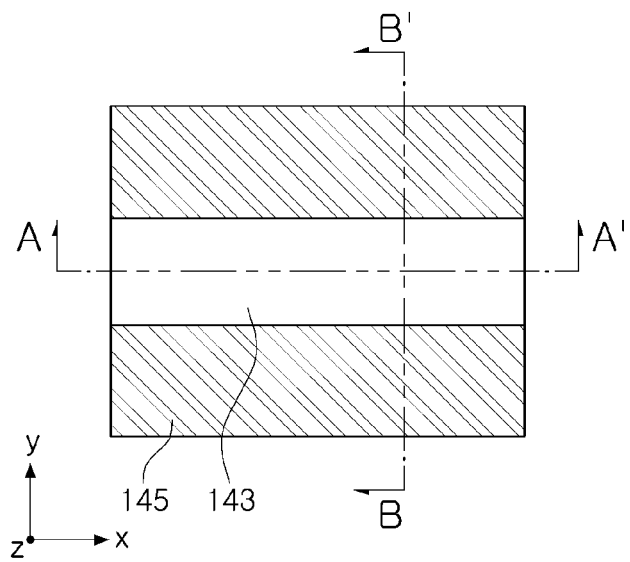
Figure 13B:
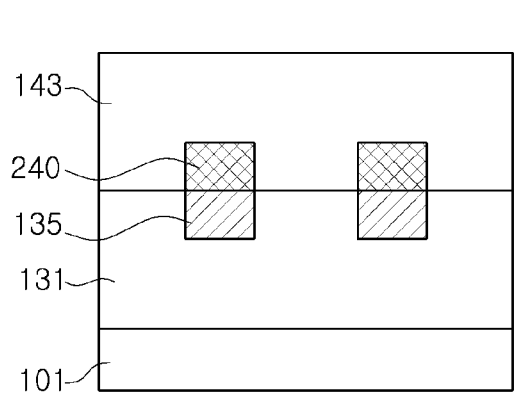
Figure 13C:
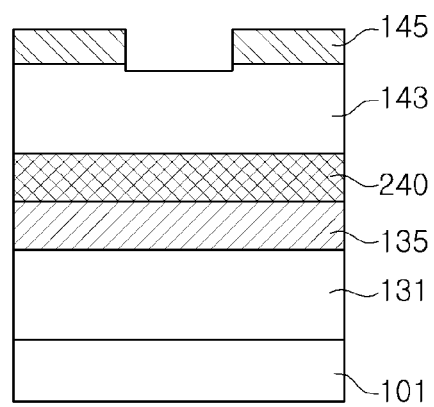

With reference to FIGS. 13A to 13C, the interlayer insulating layer 143 may be formed on the insulating pattern layer 240 and the lower insulating layer 131. A trench mask 145 may be formed on the interlayer insulating layer 143.

The interlayer insulating layer 143 may include a low-k organic polymer or inorganic substance in a manner similar to that of the lower insulating layer 131 described above. As a formation method of the interlayer insulating layer 143, plasma enhanced chemical vapor deposition (PECVD), high density plasma chemical vapor deposition (HDP-CVD), atmospheric pressure chemical vapor deposition (APCVD), spin coating, or the like may be used.

Subsequently, a hard mask layer may be formed on the interlayer insulating layer 143, and then, the trench mask 145 may be formed by dry etching the hard mask layer in a linear shape using a photoresist pattern (not shown) having an opening with a linear shape extending, for example, in an x-axis direction of FIG. 13A.

Figure 14A:
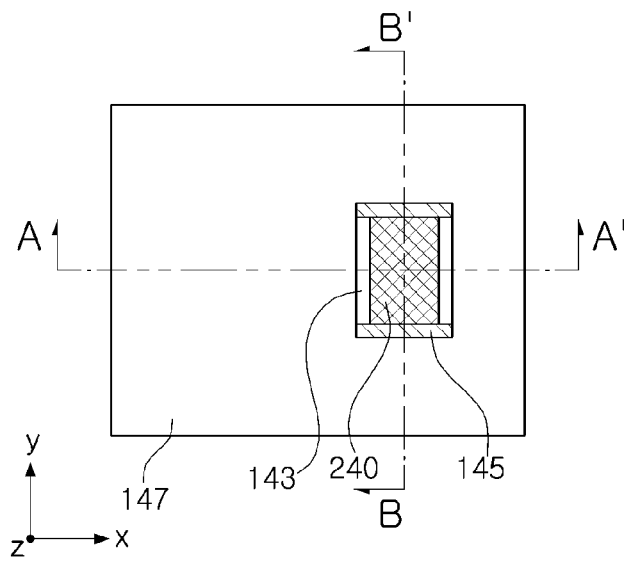
Figure 14B:
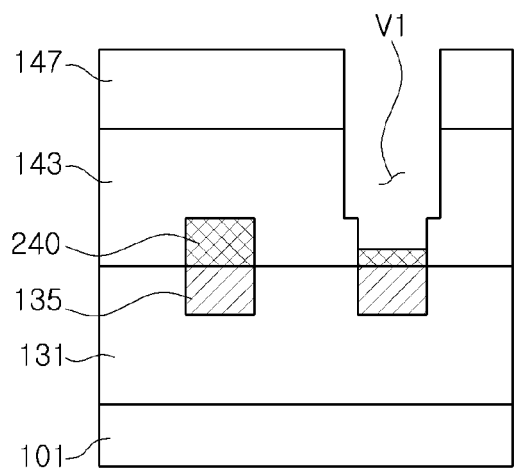
Figure 14C:
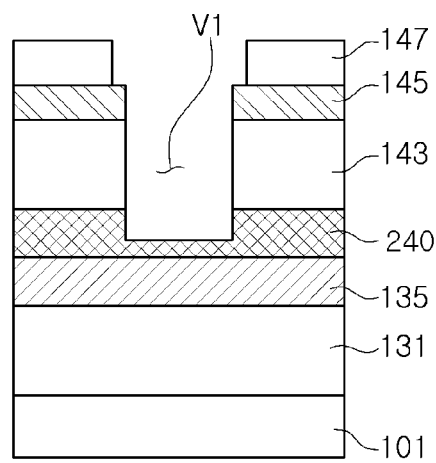
Figure 15A:
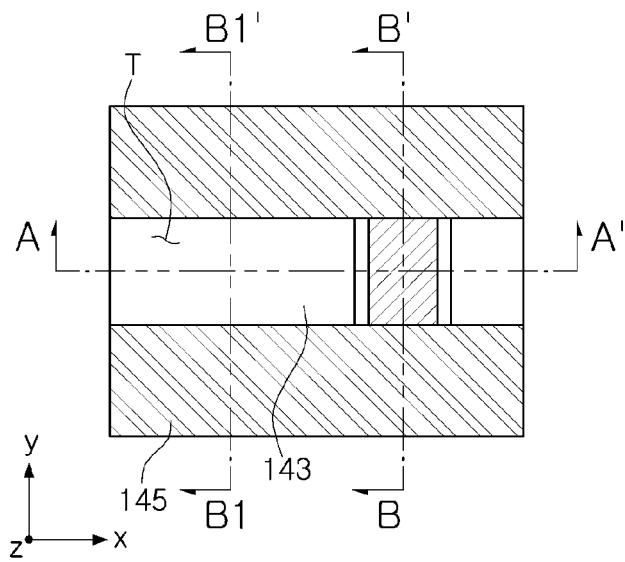
Figure 15D:
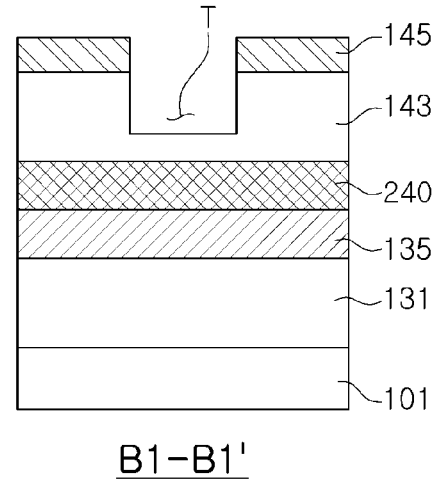
Figure 15B:
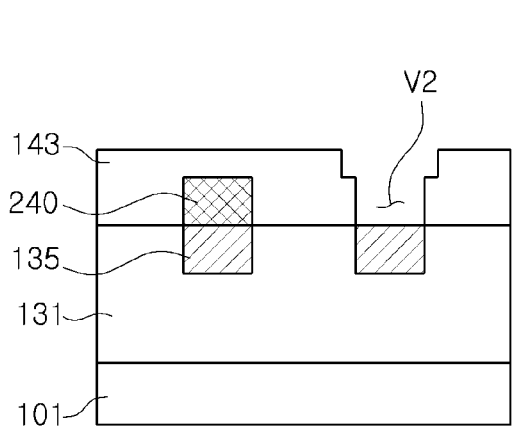
Figure 15C:
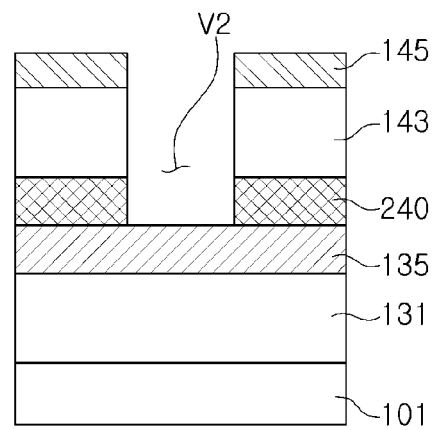

With reference to FIGS. 14A to 14C, a preparatory via hole V1 allowing the insulating pattern layer 240 to be exposed may be formed.

For example, a photoresist pattern 147 allowing the interlayer insulating layer 143 to be partially exposed may be formed on the trench mask 145 and the interlayer insulating layer 143. Then, the preparatory via hole V1 allowing the exposure of the insulating pattern layer 240 may be formed by removing a portion of the interlayer insulating layer 143 using the photoresist pattern 147. The interlayer insulating layer 143 may be removed through a dry etching process, and the insulating pattern layer 240 may serve as an etch-stop layer. A portion of the interlayer insulating layer 143 may also be exposed through the formed preparatory via hole V1.

Next, a portion of the insulating pattern layer 240 may be selectively removed with respect to the interlayer insulating layer 143. Since the interlayer insulating layer 143 and the insulating pattern layer 240 include different materials, the interlayer insulating layer 143 may have etching selectivity with the insulating pattern layer 240. For instance, under specific etching conditions, the insulating pattern layer 240 may have an etching rate faster than that of the interlayer insulating layer 143. In this stage, a portion of the insulating pattern layer 240 may be retained to prevent the exposure of the lower interconnect 135. According to an example embodiment of the present inventive concept, the operation in which a portion of the insulating pattern layer 240 may be selectively removed with respect to the interlayer insulating layer 143 may be omitted. For example, the insulating pattern layer 240 may be removed once after a trench is formed.

Next, the photoresist pattern 147 may be removed through an ashing and stripping process.

With reference to FIGS. 15A to 15D, a trench T and a via hole V2 may be formed.

The trench T may be formed by removing the interlayer insulating layer 143 using the trench mask 145 exposed after the photoresist pattern 147 is removed.

The trench T may have a depth formed in such a way that a portion of the interlayer insulating layer 143 remains on the insulating pattern layer 240. In a manner different from the illustration, the trench T may be formed such that an upper surface of the insulating pattern layer 240 is exposed.

Subsequently, the insulating pattern layer 240 within the preparatory via hole V1 (see FIGS. 14A to 14C) may be selectively removed to form the via hole V2 allowing the lower interconnect 135 to be exposed.

Figure 16A:
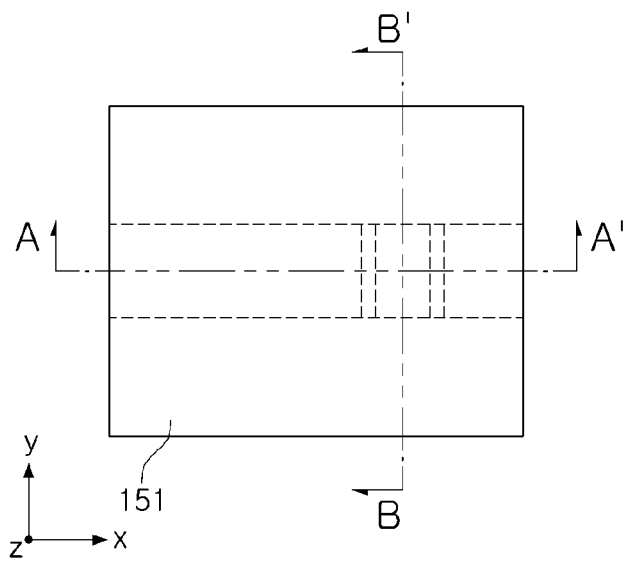
Figure 16B:
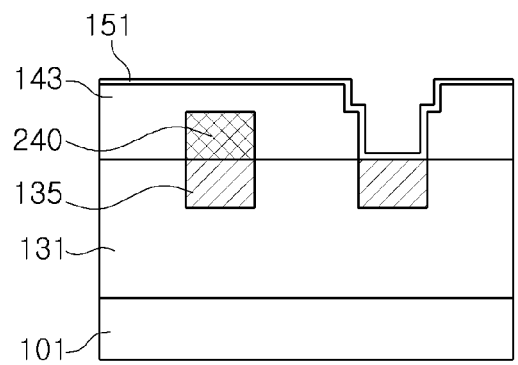
Figure 16C:
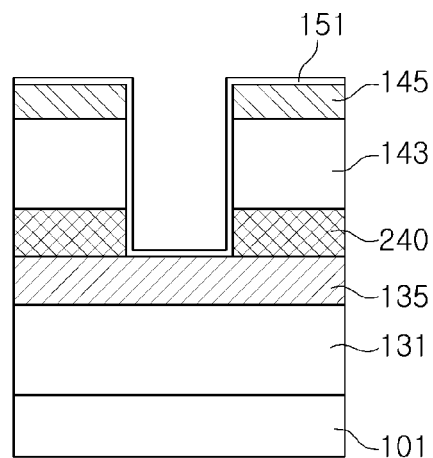

With reference to FIGS. 16A to 16C, a barrier layer 151 may be formed on sidewalls and a bottom of the trench T and the via hole V2 and on the trench mask 145.

Then, after the metal interconnect layer 153 is formed on the barrier layer 151 to fill the trench T and the via hole V2, a planarization process may be performed to allow the interlayer insulating layer 143 to be exposed, thereby forming a dual damascene interconnect structure illustrated in FIGS. 10 and 11A to 11C.

Figure 17:
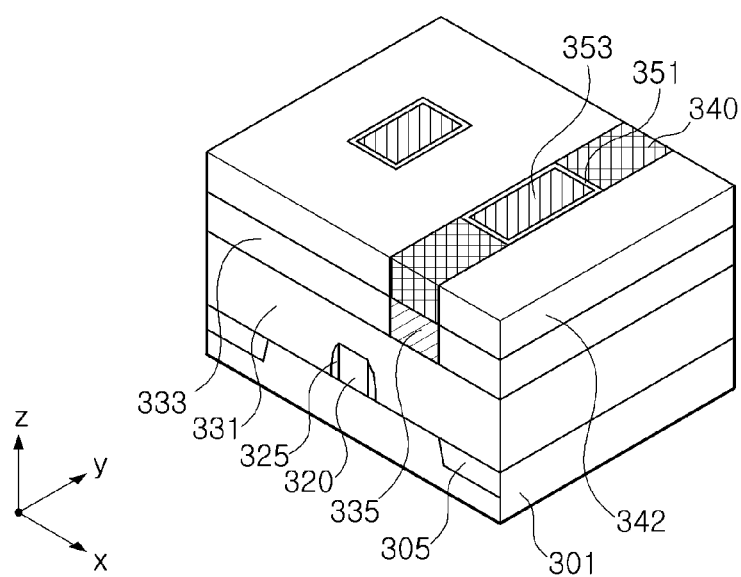
FIGS. 17 and 18A to 18C illustrate a interconnect structure for semiconductor devices according to example embodiments.
Figure 18A:
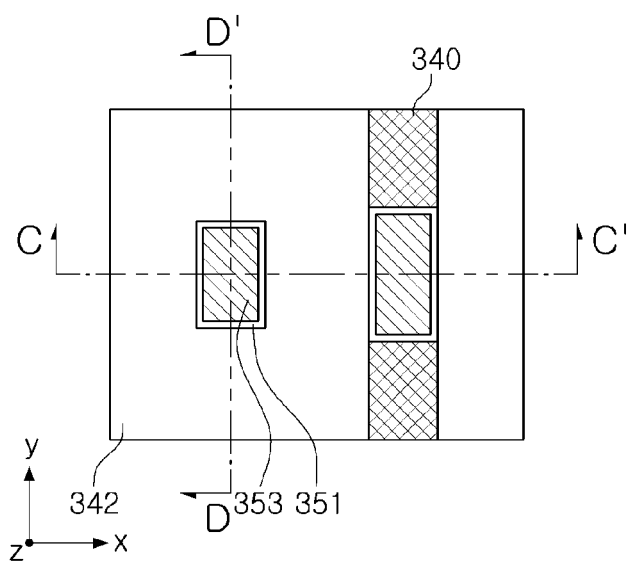
Figure 18B:
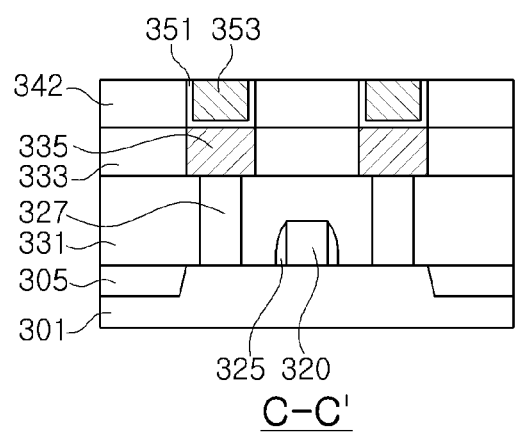
Figure 18C:
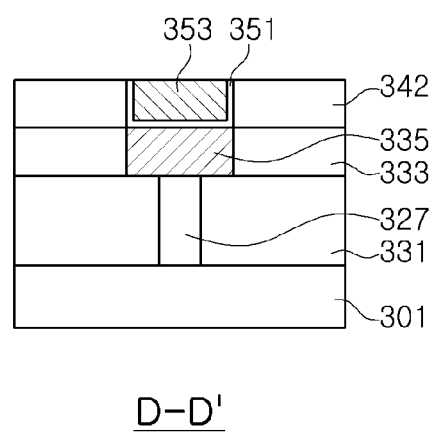

FIGS. 17 and 18A to 18C illustrate a interconnect structure for semiconductor devices according to example embodiments. Here, FIG. 17 is a perspective view, FIG. 18A is a plan view of FIG. 17, and FIGS. 18B and 18C are cross-sectional views of lines C-C' and D-D' of FIG. 18A, respectively. The example embodiments provide a structure in which a via is auto-aligned with a local interconnect through a single damascene process.

With reference to FIGS. 17 and 18A to 18C, a second lower insulating layer 333 and a lower interconnect 335 may be formed on a substrate 301. A first polymer pattern layer 340 arranged on an upper surface of the lower interconnect 335 and a second polymer pattern layer 342 arranged on an upper surface of the second lower insulating layer 333 may be formed above the substrate 301. A via metal layer 353 surrounded by the first and second polymer pattern layers 340 and 342 may be formed.

The substrate 301 may have an upper surface extending in an x-axis direction and a y-axis direction of FIG. 17. For instance, examples of the substrate 301 may include a silicon substrate, a germanium substrate, a silicon-germanium substrate, a gallium arsenide substrate, a silicon on insulator (SOI) substrate, or a semiconductor-on-insulator (SeOI) substrate, and the like. A plurality of active elements, for example, transistors, configuring an integrated circuit, and passive elements may be disposed on the substrate 301. The transistors may include a gate structure 320 and source/drain regions. The gate structure 320 may include a gate electrode and a gate insulating layer. A device isolation layer 305 defining an active region may be formed in the substrate 301. A spacer 325 may be formed on sidewalls of the gate structure 320. Contact plugs 327 may be connected to the source/drain regions. A first lower insulating layer 331 may cover the transistor. In addition, the lower interconnects 335 connected to the contact plugs and the second lower insulating layer 333 may be formed.

The first and second lower insulating layers 331 and 333 may include a low-k material to reduce an RC signal delay and crosstalk between interconnects. The first and second lower insulating layers 331 and 333 may include a low-k organic polymer or inorganic sub stance.

The lower interconnect 335 may be a metal pad and local interconnect formed in a middle of line (MOL) process. The lower interconnect 335 may contain at least one selected from a group consisting of aluminum (Al), an aluminum alloy (Al-alloy), tungsten (W), cobalt (Co), copper (Cu), or ruthenium (Ru), gold (Au), silver (Ag), and the like. A capping layer may be formed on the lower interconnect 335. The capping layer may include at least one selected from a group consisting of cobalt (Co), ruthenium (Ru), CoWP, and the like. An upper surface of the lower interconnect 335 may be coplanar with an upper surface of the second lower insulating layer 333.

The first polymer pattern layer 340 arranged on an upper surface of the lower interconnect 335 and the second polymer pattern layer 342 arranged on an upper surface of the second lower insulating layer 333 may be formed by a process in which a block copolymer layer including two types of polymer blocks is subjected to a self-assembly process directed by a difference between characteristics of upper surfaces of the lower interconnect 335 and the second lower insulating layer 333.

The via metal layer 353 may be formed on the lower interconnect 335 within a via hole from which a portion of the first polymer pattern layer 340 has been removed. A barrier layer 351 may be formed between the via metal layer 335 and the first and second polymer pattern layers 340 and 342. The barrier layer 351 may prevent a component, for example, copper, of the via metal layer 353 from diffusing.

FIGS. 19A to 19C, 20A to 20C, 21A to 21C, and 22A to 22C illustrate a method of forming interconnects for semiconductor devices according to example embodiments.

Figure 19A:
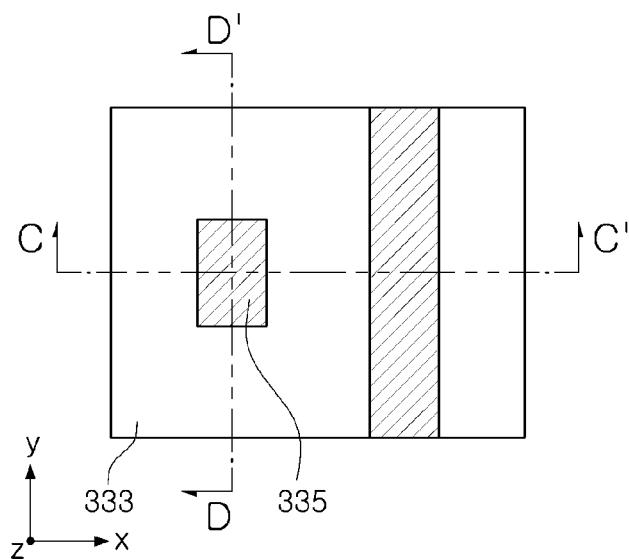
FIGS. 19A to 19C, 20A to 20C, 21A to 21C, and 22A to 22C illustrate a method of forming interconnects for semiconductor devices according to example embodiments.
Figure 19B:
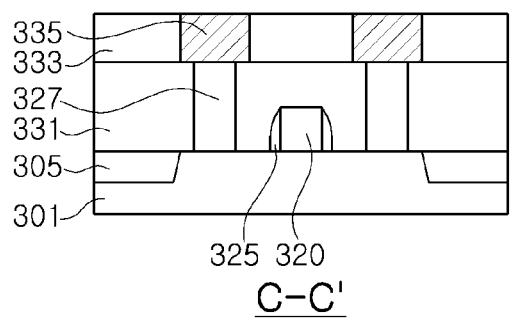
Figure 19C:
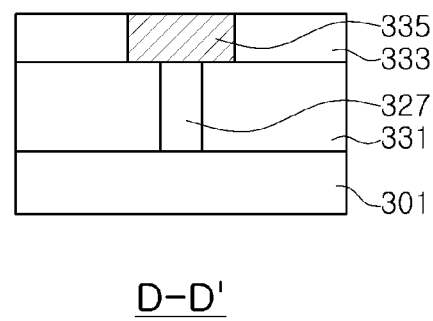

With reference to FIGS. 19A to 19C, the second lower insulating layer 333 and the lower interconnect 335 may be formed above the substrate 301. The lower interconnect 335 may include a local interconnect extending, for example, in a y-axis direction to have a linear shape, and a metal pad having a quadrangular shape. An upper surface of the second lower insulating layer 331 and an upper surface of the lower interconnect 335 may have different chemical properties. For instance, one surface of the upper surfaces of the second lower insulating layer 331 and the lower interconnect 335 may be hydrophilic and the other surface may be hydrophobic. The upper surfaces of the second lower insulating layer 331 and the lower interconnect 335 may be subjected to a surface treatment so as to have different chemical properties.

Figure 20A:
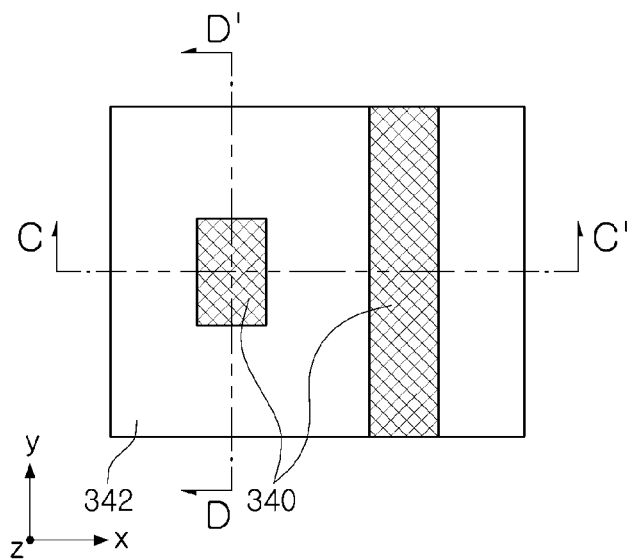
Figure 20B:
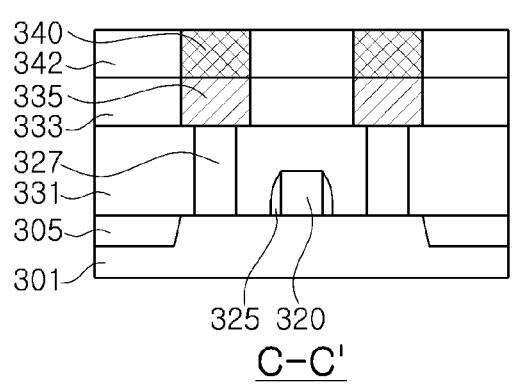
Figure 20C:
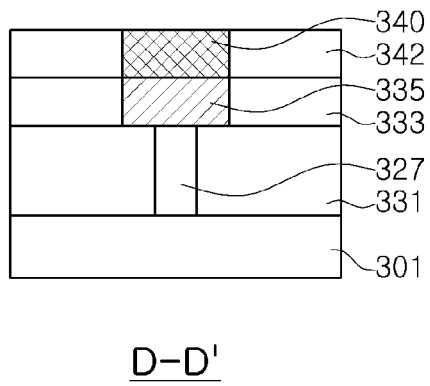

With reference to FIGS. 20A to 20C, the first polymer pattern layer 340 and the second polymer pattern layer 342 may be formed on the lower interconnect 335 and the second lower insulating layer 331, respectively.

A block copolymer layer may be formed on the lower interconnect 335 and the second lower insulating layer 331 through a spin coating process, and then, the block copolymer layer may be heat treated to cause phase separation into the first polymer pattern layer 340 and the second polymer pattern layer 342. The first polymer pattern layer 340 may be formed on an upper surface of the lower interconnect 335, and the second polymer pattern layer 342 may be formed on an upper surface of the second lower insulating layer 333. The phase separation may be caused by the self-assembly of the block copolymer layer directed by the upper surface of the lower interconnect 335 and the upper surface of the second lower insulating layer 333 having different chemical properties, for example, hydrophilic and hydrophobic properties. The heat treatment may be performed at a glass transition temperature Tg of the block copolymer layer or higher. The heat treatment may be performed at a temperature between about 100° C. to about 350° C.

Figure 21A:
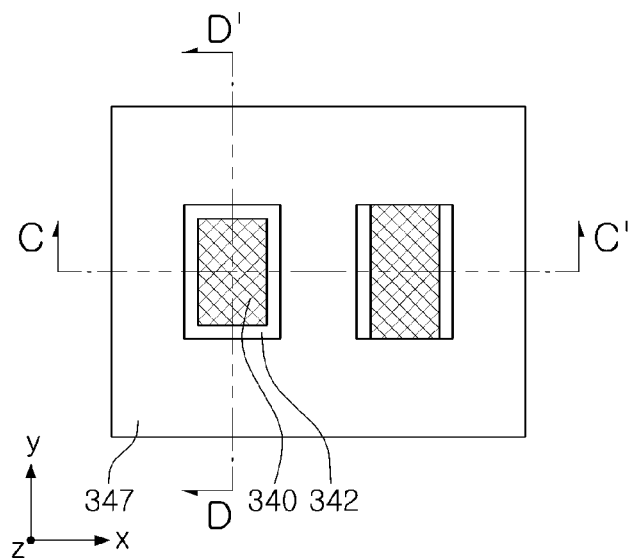
Figure 21B:
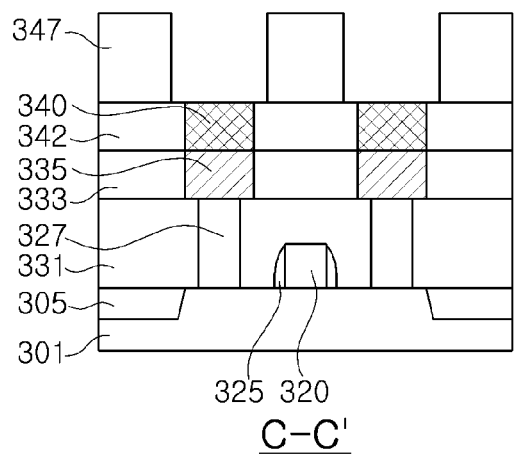
Figure 21C:
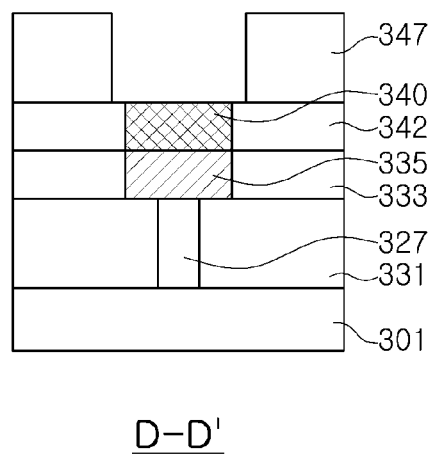

With reference to FIGS. 21A to 21C, a photoresist pattern 347 allowing the first polymer pattern layer 340 to be partially exposed may be formed. The photoresist pattern 347 may have an opening formed in a position thereof to be aligned with a position of a portion of the first polymer pattern layer 340 to be removed. In consideration of misalignment, the opening of the photoresist pattern 347 may have a width greater than a line width of the first polymer pattern layer 340, for example, in an x-axis direction or in a y-axis direction of FIG. 21A. Thus, the second polymer pattern layer 342 may be exposed through the opening.

Figure 22A:
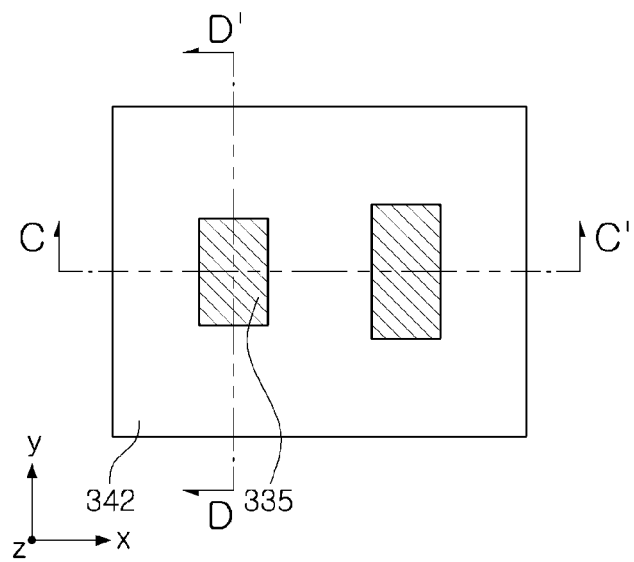
Figure 22B:
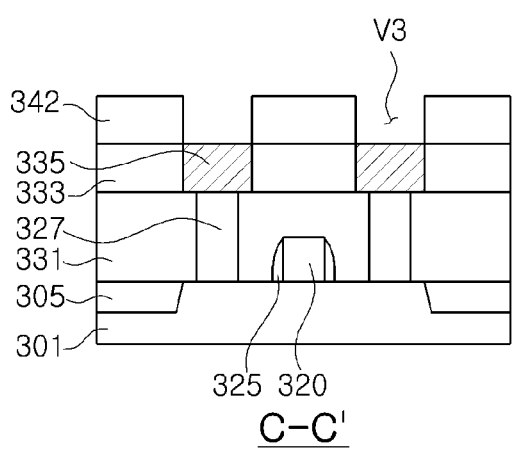
Figure 22C:
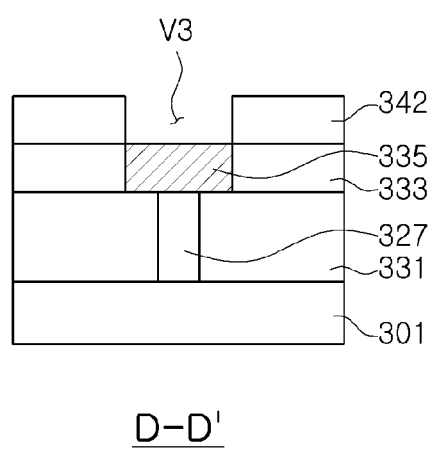

With reference to FIGS. 22A to 22C, a via hole V3 allowing the lower interconnect 335 to be exposed may be formed by selectively removing the first polymer pattern layer 340 using the photoresist pattern 347.

Next, the barrier layer 351 may be formed on a sidewall of the via hole V3 and an upper surface of the lower interconnect 335, and the via metal layer 353 may be formed on the barrier layer 351 to fill the via hole V3. Then, a planarization process may be performed to allow the second polymer pattern layer 342 to be exposed. Thus, a single damascene via structure illustrated in FIGS. 17 and 18A to 18C may be formed.

The barrier layer 351 may contain at least one selected from a group consisting of Ti, Ta, W, TiN, TaN, WN, WCN, TiSiN, TaSiN and WSiN. As a formation method of the barrier layer 351, any one selected from physical vapor deposition (PVD), chemical vapor deposition (CVD), and atomic layer deposition (ALD) may be used. The via metal layer 353 may include at least one selected from a group consisting of aluminum (Al), an aluminum alloy (Al-alloy), copper (Cu), gold (Au), silver (Ag), tungsten (W) and molybdenum (Mo). As a method of forming the via metal layer 353, any one selected from a reflow method performed after a sputtering process, a chemical vapor deposition (CVD) method, and an electroplating method may be used. For example, when the electroplating method is used, a seed layer may be formed to allow a current to flow at the time of electrolysis.

Figure 23:
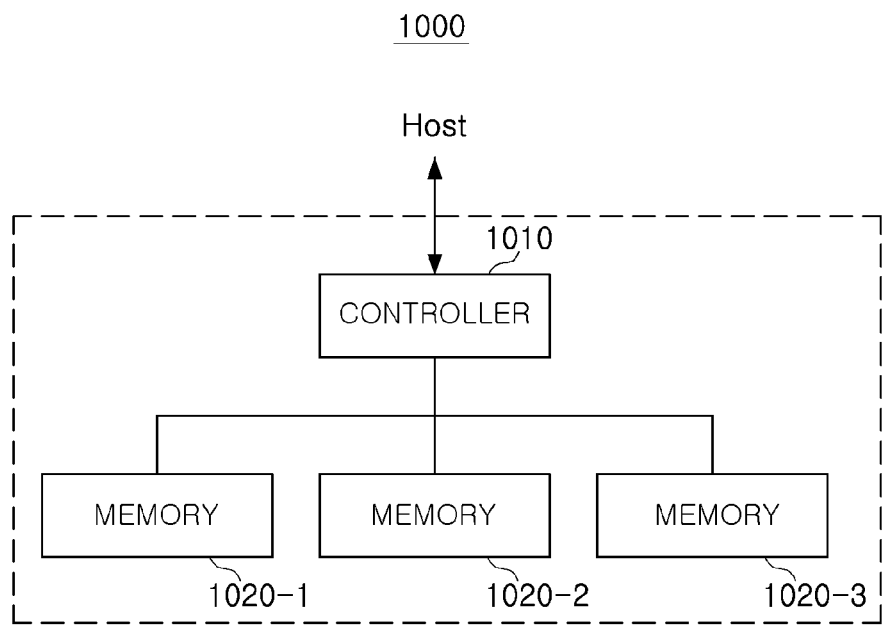
FIG. 23 is a block diagram of a storage apparatus including a semiconductor device according to certain embodiments.

FIG. 23 is a block diagram of a storage apparatus including a semiconductor device according to certain embodiments.

With reference to FIG. 23, a storage apparatus 1000 according to an example embodiment of the present inventive concept may include a controller 1010 communicating with a host, and memories 1020-1, 1020-2 and 1020-3 storing data therein. The host communicating with the controller 1010 may be various types of electronic device in which the storage apparatus 1000 is mounted, and may be, for example, a smartphone, a digital camera, a desktop computer, a laptop computer, a media player, or the like. The controller 1010 may receive a data writing or data reading request transferred by the host to enable data to be written to the memories 1020-1, 1020-2, and 1020-3 or may generate a command CMD to allow data to be read from the memories 1020-1, 1020-2, and 1020-3. The controller 1010 or the memories 1020-1, 1020-2, and 1020-3 may be manufactured through the method of forming interconnects for semiconductor devices according to various example embodiments as described above. As illustrated in FIG. 23, one or more memories 1020-1, 1020-2, and 1020-3 may be connected to the controller 1010 in parallel within the storage apparatus 1000. The storage apparatus 1000 having a relatively large capacity as in a solid state drive (SSD) may be implemented by connecting the plurality of memories 1020-1, 1020-2, and 1020-3 to the controller 1010 in parallel.

Figure 24:
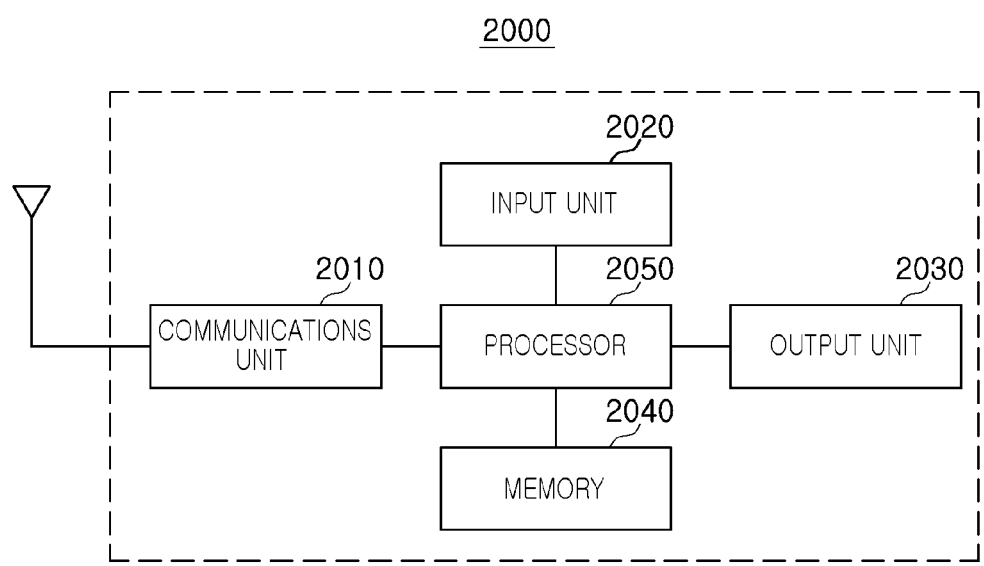
FIG. 24 is a block diagram of an electronic device including a semiconductor device according to certain embodiments.

FIG. 24 is a block diagram of an electronic device including a semiconductor device according to certain embodiments.

With reference to FIG. 24, an electronic device 2000 according to an example embodiment of the present inventive concept may include a communications unit 2010, an input unit 2020, an output unit 2030, a memory 2040, and a processor 2050.

The communications unit 2010 may include a wired and wireless communications module and may include a wireless internet module, a near-field communications module, a global positioning system (GPS) module, a mobile communications module, and the like. The wired and wireless communications module included in the communications unit 2010 may be connected to an external communications network via various communications protocols to transmit or receive data. The input unit 2020 may be a module provided to control operations of the electronic device 2000 by a user, and may include a mechanical switch, a touchscreen, a sound recognition module, and the like. In addition, the input unit 2020 may also include a mouse operating in a trackball or laser pointer scheme or the like, or a finger mouse device, and also, may further include various sensor modules through which data may be input by a user. The output unit 2030 may output information processed by the electronic device 2000 in audio or visual form, and the memory 2040 may store a program for processing or controlling by the processor 2050, data, or the like. The processor 2050 may transfer a command to the memory 2040 according to a required operation to thus write data thereto or read data therefrom. The memory 2040 may be embedded in the electronic device 2000 or may communicate with the processor 2050 via a separate interface. In the case of communicating with the processor 2050 via the separate interface, the processor 2050 may write data to the memory 2040 or read data therefrom via various interface standards such as SD, SDHC, SDXC, MICRO SD, USB, and the like. The processor 2050 may control operations of respective parts included in the electronic device 2000. The processor 2050 may perform controlling and processing relevant to voice communication, video communication, data communications, and the like, or may also perform controlling and processing for multimedia playback and management. In addition, the processor 2050 may process an input transferred through the input unit 2020 by a user and may output the result thereof via the output unit 2030. In addition, the processor 2050 may write data required to control operations of the electronic device 2000 to the memory 2040 or read data therefrom. At least one of the processor 2050 and the memory 2040 may be manufactured through a method of forming interconnects for semiconductor devices according to various example embodiments as described above.

Figure 25:
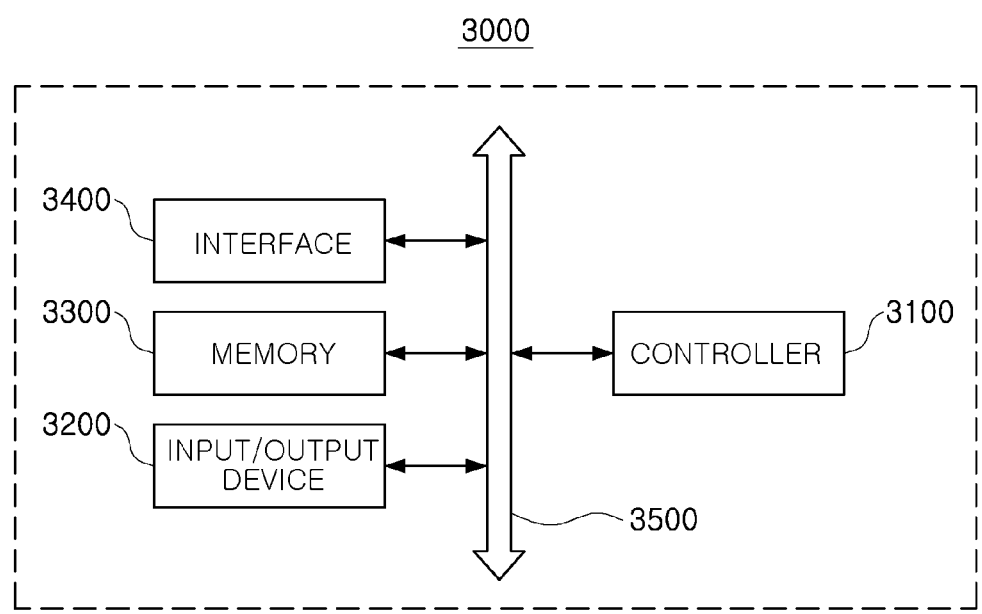
FIG. 25 is a block diagram of a system including a semiconductor device according to certain embodiments.

FIG. 25 is a block diagram of a system including a semiconductor device according to certain embodiments.

With reference to FIG. 25, a system 3000 may include a controller 3100, an input/output device 3200, a memory 3300, and an interface 3400. The system 3000 may be a mobile system or a system transmitting or receiving information. The mobile system may be a personal digital assistant (PDA), a portable computer, a web tablet, a wireless phone, a mobile phone, a digital music player or a memory card. The controller 3100 may execute a program and may serve to control the system 3000. The controller 3100 may be, for example, a microprocessor, a digital signal processor, a microcontroller or a device similar thereto. The input/output device 3200 may input or output data of the system 3000. The system 3000 may be connected to an external device, for example, a personal computer or a network to exchange data therebetween using the input/output device 3200. The input/output device 3200 may be, for example, a keypad, a keyboard, or a display. The memory 3300 may store a code and/or data for operations of the controller 3100, and/or may store data processed by the controller 3100 therein. The interface 3400 may serve as a data transmission path between the system 3000 and an external, different device. The controller 3100, the input/output device 3200, the memory 3300, and the interface 3400 may communicate with one another via a bus 3500. At least one of the controller 3100 and the memory 3300 may be manufactured through a method of forming interconnects for semiconductor devices according to various example embodiments as described above.

As set forth above, according to example embodiments of the present disclosure, a method of forming interconnects for semiconductor devices, in which a via may be auto-aligned with a lower interconnect through a damascene process, is provided.

While example embodiments have been shown and described above, it will be apparent to those skilled in the art that modifications and variations could be made without departing from the scope of the present disclosure as defined by the appended claims.

What is claimed is:

1. A method of forming an interconnect for a semiconductor device, the method comprising:
   providing a semiconductor substrate;
   forming a lower insulating layer on the semiconductor substrate;
   forming a lower interconnect in the lower insulating layer and on the semiconductor substrate;
   forming an insulating pattern layer on an upper surface of the lower interconnect through self-assembly;
   forming an interlayer insulating layer and a trench mask on the insulating pattern layer;
   forming a photoresist pattern on the trench mask to allow the interlayer insulating layer to be partially exposed;
   forming a first via hole allowing the insulating pattern layer to be exposed by removing a portion of the interlayer insulating layer using the photoresist pattern;
   removing the photoresist pattern;
   forming a trench by etching the interlayer insulating layer using the trench mask after removing the photoresist pattern;
   forming a second via hole allowing the lower interconnect to be exposed by selectively etching a portion of the insulating pattern layer exposed by the first via hole; and
   filling the trench and the second via hole with a conductive material.

2. The method of claim 1, wherein the forming of the insulating pattern layer comprises:
   forming a block copolymer layer on the lower interconnect and the lower insulating layer; and
   heating the block copolymer layer to cause a phase separation of the block copolymer layer into a first polymer pattern layer arranged on an upper surface of the lower interconnect and a second polymer pattern layer arranged on an upper surface of the lower insulating layer.

3. The method of claim 2, wherein the first polymer pattern layer and the second polymer pattern layer have etching selectivity with respect to each other.

4. The method of claim 2, wherein the block copolymer layer comprises a silicon-containing polymer.

5. The method of claim 4, wherein the block copolymer layer comprises any one of a group consisting of polybutadiene-block-polydimethylsiloxane, polystyrene-block-polydimethylsiloxane, polyisobtylene-block-polydimethylsiloxane, polystyrene-block-polyferrocenyldimethylsilane, and polystyrene-block-polyferrocenylethylmethylsilane.

6. The method of claim 2, wherein the heating is performed at a temperature of 100° C. to 350° C.

7. The method of claim 1, wherein the forming of the trench mask comprises:
   forming a hard mask layer on the interlayer insulating layer; and
   dry etching the hard mask layer in a linear shape.

8. The method of claim 1, wherein the first via hole is formed by dry etching a portion of the interlayer insulating layer to allow the insulating pattern layer to be exposed using the photoresist pattern as an etching mask.

9. The method of claim 1, wherein the filling of the trench and the second via hole comprises:
   forming a barrier layer on sidewalls and a bottom of the trench, on the second via hole, and on the trench mask;
   forming a metal interconnect layer on the barrier layer to fill the trench and the second via hole; and
   performing a planarization process such that the interlayer insulating layer is exposed.

10. The method of claim 1, wherein the insulating pattern layer is formed by forming a self-assembled monolayer selectively directly connected to the upper surface of the lower interconnect.

11. The method of claim 10, wherein the self-assembled monolayer comprises an organic self-assembled monolayer or a functionalized nanoparticle.

12. The method of claim 1, wherein a first portion of the insulating pattern layer is removed during forming the first via hole, and a second portion of the insulating pattern layer is removed during forming the second via hole.

13. A method of forming an interconnect for a semiconductor device, the method comprising:
   providing a semiconductor substrate;
   forming a first insulating layer on the semiconductor substrate;
   forming a first interconnect in the first insulating layer and on the semiconductor substrate;
   forming an insulating pattern layer on the first interconnect by self-assembly;
   forming a second insulating layer on the insulating pattern layer and first insulating layer;
   forming photoresist pattern to remove a first portion of the insulating pattern layer and a portion of the second insulating layer;
   forming a via hole by etching a second portion of the insulating pattern layer; and
   filling the via hole with a conductive material,
   wherein, in forming the photoresist pattern, the photoresist pattern includes an opening having a width in a first direction greater than a width of the first portion of the insulating pattern layer in the first direction.

14. The method of claim 13, wherein, in forming the insulating pattern layer, the insulating pattern layer includes a block copolymer layer or a self-assembled monolayer.

15. The method of claim 13, wherein the insulating pattern layer includes a block copolymer layer including a first polymer pattern on the first interconnect and a second polymer pattern on the first insulating layer, and
   wherein, in forming the photoresist pattern to remove the first portion of the insulating pattern layer, the first portion of the insulating pattern layer is removed by selectively etching the first polymer pattern.

16. The method of claim 13, further comprising:
   forming a hard mask layer on the second insulating layer to form a trench mask; and
   removing a portion of the second insulating layer by using the trench mask.

17. The method of claim 16, wherein, in forming the photoresist pattern, the photoresist pattern includes an opening having a width in a second direction perpendicular to the first direction to expose a portion of the trench mask.

* * * * *